United States Patent
Geng et al.

(10) Patent No.: US 11,752,579 B2
(45) Date of Patent: Sep. 12, 2023

(54) HIGH RELIABILITY LEADFREE SOLDER ALLOYS FOR HARSH SERVICE CONDITIONS

(71) Applicant: INDIUM CORPORATION, Utica, NY (US)

(72) Inventors: Jie Geng, Utica, NY (US); Hongwen Zhang, Utica, NY (US); Ning-Cheng Lee, New Hartford, NY (US)

(73) Assignee: INDIUM CORPORATION, Utica, NY (US)

( * ) Notice: Subject to any disclaimer, the term of this patent is extended or adjusted under 35 U.S.C. 154(b) by 483 days.

(21) Appl. No.: 16/801,556

(22) Filed: Feb. 26, 2020

(65) Prior Publication Data

US 2020/0269360 A1    Aug. 27, 2020

Related U.S. Application Data

(60) Provisional application No. 62/810,619, filed on Feb. 26, 2019.

(51) Int. Cl.
*B23K 35/26* (2006.01)
*B23K 35/02* (2006.01)
(Continued)

(52) U.S. Cl.
CPC .......... *B23K 35/262* (2013.01); *B23K 35/025* (2013.01); *H05K 1/181* (2013.01); *B23K 2101/42* (2018.08); *B23K 2103/08* (2018.08)

(58) Field of Classification Search
CPC .... B23K 35/262; B23K 35/025; C22C 13/02; C22C 13/00; H05K 1/181
See application file for complete search history.

(56) References Cited

U.S. PATENT DOCUMENTS

2016/0279741 A1    9/2016    Ukyo et al.

FOREIGN PATENT DOCUMENTS

| CN | 105063419 | 11/2015 |
| CN | 106163732 | 11/2016 |

(Continued)

OTHER PUBLICATIONS

EP 3246421 A1, Akiyama et al., "Tin Based Solder Alloy and Package Structure Using Same", Nov. 2017; pp. 1-27. (Year: 2017).*

(Continued)

*Primary Examiner* — Jasmine J Clark
(74) *Attorney, Agent, or Firm* — Sheppard, Mullin, Richter & Hampton LLP

(57) ABSTRACT

High reliability leadfree solder alloys for harsh service conditions are disclosed. In some embodiments, a solder alloy comprises 2.5-4.0 wt % Ag; 0.4-0.8 wt % Cu; 5.0-9.0 wt % Sb; 1.5-3.5 wt % Bi; 0.05-0.35 wt % Ni; and a remainder of Sn. In some embodiments, an apparatus comprises: a component comprising: a main ceramic body, and a side surface having disposed thereon an electrode and a thermal pad; a copper substrate; and a solder alloy electrically coupling the component and the copper substrate, wherein the solder alloy comprises: 2.5-4.0 wt % Ag; 0.4-0.8 wt % Cu; 5.0-9.0 wt % Sb; 1.5-3.5 wt % Bi; 0.05-0.35 wt % Ni; and a remainder of Sn. In some embodiments, an apparatus comprises: a light-emitting diode (LED) component; a Metal Core Printed Circuit Board (MCPCB); and a solder alloy electrically coupling the LED component and the MCPCB, wherein the solder alloy comprises: 2.5-4.0 wt % Ag; 0.4-0.8 wt % Cu; 5.0-9.0 wt % Sb; 1.5-3.5 wt % Bi; 0.05-0.35 wt % Ni; and a remainder of Sn.

20 Claims, 13 Drawing Sheets

(51) Int. Cl.
*H05K 1/18* (2006.01)
*B23K 101/42* (2006.01)
*B23K 103/08* (2006.01)

(56) References Cited

FOREIGN PATENT DOCUMENTS

| | | | |
|---|---|---|---|
| CN | 107635716 | 1/2018 | |
| EP | 2982469 A1 | 2/2016 | |
| EP | 3246421 A1 * | 11/2017 | ........... B23K 35/262 |
| JP | 2017170522 | 9/2017 | |
| WO | WO 2016/179358 | 11/2016 | |

OTHER PUBLICATIONS

Second Office Action dated Jun. 15, 2022 for Chinese Application No. 2020800162688.
Office Action dated Jan. 24, 2022 for Chinese Application No. 202080016268.8.
International Search Report and Written Opinion dated May 15, 2020 for International Application No. PCT/US2020/019831.
International Preliminary Report on Patentability dated Aug. 25, 2021 for International Application No. PCT/US2020/019831.
Notification of the Decision of Rejection dated May 6, 2023 for Chinese Application No. 202080016268.8.

* cited by examiner

| Alloy No. | Designation | Sn | Ag | Cu | Sb | Bi | In | Ni | Solidus | Liquidus |
|---|---|---|---|---|---|---|---|---|---|---|
| 1 | 3207SN6003 | 89.5 | 3.4 | 0.7 | 6.1 | | | 0.3 | 222.46 | 235.27 |
| 2 | 3807SN6003 | 89.1 | 3.8 | 0.7 | 6.1 | | | 0.3 | 222.82 | 235.83 |
| 3 | 3807SN5501 | 89.9 | 3.8 | 0.7 | 5.5 | | | 0.1 | 222.98 | 235.02 |
| 4 | SN5501 | 90.7 | 3.2 | 0.5 | 5.5 | | | 0.1 | 222.61 | 234.23 |
| 5 | SN5S005 | 90.55 | 3.2 | 0.7 | 5.5 | | | 0.05 | 223.31 | 234.91 |
| 6 | 3207BN3202 | 87.2 | 3.2 | 0.7 | 5.5 | 3.2 | | 0.2 | 215.12 | 229.82 |
| 7 | 3207SBNS54301 | 86 | 3.2 | 0.7 | 5.5 | 4.5 | | 0.1 | | |
| 8 | 3807SBN6045O1 | 84.9 | 3.8 | 0.7 | 6 | 4.5 | | 0.1 | | |
| 9 | 3207SBNS5450501 | 85.5 | 3.2 | 0.7 | 5.5 | 4.5 | 0.5 | 0.1 | | |
| 10 | 3807SBIN6045O301 | 84.6 | 3.8 | 0.7 | 6 | 4.5 | 0.3 | 0.1 | | |
| 11 | 3207SBIN5532O101 | 87.2 | 3.2 | 0.7 | 5.5 | 3.2 | 0.1 | 0.1 | | |
| 12 | 3207SBIN5450101 | 85.9 | 3.2 | 0.7 | 5.5 | 4.5 | 0.1 | 0.1 | | |
| 13 | 3207BIN320502 | 86.7 | 3.2 | 0.7 | 5.5 | 3.2 | 0.5 | 0.2 | 214.38 | 228.75 |
| 14 | 3207BIN320503 | 86.6 | 3.2 | 0.7 | 5.5 | 3.2 | 0.5 | 0.3 | 217.65 | 229.73 |
| 15 | 3207BIN150503 | 88.3 | 3.2 | 0.7 | 5.5 | 1.5 | 0.5 | 0.3 | 219.36 | 232.03 |
| 16 | 3207IN0503 | 89.8 | 3.2 | 0.7 | 5.5 | | 0.5 | 0.3 | 221.56 | 235.12 |
| 17 | 3807SBI3503525 | 89 | 3.8 | 0.7 | 3.5 | 0.5 | 2.5 | | 214.98 | 222.77 |
| 18 | 3809SI5505 | 89.3 | 3.8 | 0.9 | 5.5 | | 0.5 | | 223.67 | 228.69 |
| 19 | SI3505 | 92.1 | 3.2 | 0.7 | 3.5 | | 0.5 | | 219.46 | 230.47 |
| 20 | SI5503 | 90.5 | 3.2 | 0.5 | 5.5 | | 0.3 | | 221.88 | 236.25 |
| 21 | 3207Sb5.5 | 90.6 | 3.2 | 0.7 | 5.5 | | | | 223.62 | 232.67 |
| 22 | SB5503 | 90.5 | 3.2 | 0.5 | 5.5 | 0.3 | | | 221.76 | 236.03 |
| 23 | 3810SB6003 | 88.9 | 3.8 | 1 | 6 | 0.3 | | | 222.85 | 231.46 |
| 24 | SACSBN | 90.8 | 3.8 | 0.7 | 1.5 | 3 | | 0.2 | 212.61 | 221.65 |
| 25 | SAC305 | 96.5 | 3 | 0.5 | | | | | 217 | 220 |

FIG. 10

| Alloy | Flux | Chip resistor type | 0-1 | 1-1.5 | 1.5-2 | 2-2.5 | 2.5-3 | Total |
|---|---|---|---|---|---|---|---|---|
| Alloy 6 | A | 0603 | 0 | 0 | | | | 0 |
| Alloy 6 | B | 0805 | 0 | 0 | | | | 0 |
| Alloy 11 | A | 0603 | 0 | 0 | 0 | | | 0 |
| Alloy 19 | A | 0805 | 0 | 0 | 0 | | | 0 |
| Alloy 22 | A | 0603 | 0 | 1 | 0 | 1 | | 1 |
| Alloy 22 | B | 0805 | 0 | 0 | 1 | 2 | 1 | 5 |
| Alloy 22 | C | 0603 | 0 | 0 | 0 | 0 | 1 | 1 |
| Alloy 23 | A | 0805 | 0 | 0 | 0 | | | 0 |
| Alloy 23 | B | 0603 | 0 | 0 | 0 | | | 0 |
|  |  | 0805 | 1 | 1 | 1 | 1 | | 3 |
|  |  | 0603 | 0 | 0 | 0 | 1 | | 1 |
|  |  | 0805 | 0 | 0 | 1 | 3 | 6 | 10 |
|  |  | 0603 | 0 | 0 | 1 | 3 | 7 | 11 |
|  |  | 0805 | 0 | 0 | 0 | 1 | | 1 |
|  |  | 0603 | 0 | 0 | 0 | 1 | | 1 |
|  |  | 0805 | 0 | 1 | 2 | 3 | | 6 |

FIG. 14

| Alloy | Flux | Chip resistor type | Cycles under TCT -40/+150°C | | | | | | | | | | |
|---|---|---|---|---|---|---|---|---|---|---|---|---|---|
| | | | 0-1k | 1-1.5k | 1.5-2k | 2-2.5k | 2.5-3k | 3-3.5k | 3.5-4k | 4-4.5k | 4.5-5k | 5-5.5k | 5.5-6k | Total |
| Alloy 1 | A | 0603 | 0 | 0 | 0 | 1 | 0 | 4 | 7 | 10 | 0 | 5 | 6 | 33 |
| Alloy 1 | B | 0805 | 0 | 0 | 0 | 4 | 5 | 8 | 3 | 12 | 0 | 5 | 4 | 41 |
| Alloy 2 | A | 0603 | 0 | 0 | 0 | 0 | 0 | 2 | 1 | 6 | 0 | 1 | 7 | 17 |
| Alloy 3 | A | 0805 | 0 | 0 | 1 | 1 | 3 | 8 | 4 | 2 | 0 | 6 | 2 | 27 |
| Alloy 4 | A | 0603 | 0 | 0 | 1 | 1 | 0 | 13 | 3 | 9 | 0 | 4 | 7 | 38 |
| Alloy 4 | A | 0805 | 0 | 0 | 2 | 11 | 2 | 12 | 6 | 5 | 0 | 2 | 0 | 38 |
| Alloy 6 | A | 0603 | 0 | 0 | 0 | 2 | 3 | 13 | 7 | 14 | 0 | 4 | 0 | 42 |
| Alloy 6 | B | 0805 | 0 | 0 | 0 | 4 | 6 | 9 | 1 | 6 | 0 | 1 | 4 | 37 |
| Alloy 13 | A | 0603 | 0 | 0 | 0 | 0 | 0 | 0 | 8 | 3 | 0 | 1 | 0 | 8 |
| Alloy 13 | B | 0805 | 0 | 0 | 1 | 2 | 1 | 6 | 0 | 7 | 0 | 5 | 6 | 36 |
| Alloy 14 | A | 0603 | 0 | 0 | 0 | 0 | 0 | 0 | 0 | 1 | 0 | 2 | 0 | 3 |
| Alloy 15 | A | 0805 | 0 | 0 | 0 | 0 | 1 | 1 | 2 | 3 | 0 | 6 | 1 | 13 |
| Alloy 16 | A | 0603 | 0 | 0 | 0 | 0 | 0 | 0 | 0 | 1 | 0 | 2 | 2 | 8 |
| Alloy 16 | A | 0805 | 0 | 0 | 0 | 1 | 2 | 1 | 2 | 2 | 0 | 6 | 0 | 14 |
| Alloy 25 | A | 0603 | 0 | 0 | 0 | 0 | 0 | 0 | 0 | 2 | 0 | 0 | 1 | 3 |
| Alloy 25 | A | 0805 | 0 | 0 | 0 | 1 | 2 | 1 | 4 | 4 | 0 | 3 | 6 | 20 |
| Alloy 13 | A | 0603 | 0 | 0 | 0 | 0 | 0 | 2 | 3 | 2 | 0 | 0 | 4 | 11 |
| Alloy 13 | B | 0805 | 0 | 0 | 0 | 0 | 1 | 0 | 4 | 4 | 0 | 0 | 1 | 10 |
| Alloy 14 | A | 0603 | 1 | 0 | 4 | 0 | 0 | 1 | 1 | 12 | 0 | 3 | 7 | 29 |
| Alloy 15 | A | 0805 | 0 | 1 | 0 | 3 | 1 | 4 | 1 | 6 | 0 | 1 | 1 | 10 |
| Alloy 16 | A | 0603 | 0 | 1 | 1 | 6 | 0 | 9 | 8 | 10 | 0 | 0 | 4 | 37 |
| Alloy 16 | A | 0805 | 0 | 0 | 1 | 0 | 1 | 10 | 6 | 11 | 0 | 3 | 4 | 32 |
| Alloy 25 | A | 0603 | 0 | 0 | 1 | 0 | 2 | 10 | 9 | 6 | 0 | 1 | 5 | 49 |
| Alloy 25 | B | 0805 | 0 | 0 | 1 | 1 | 0 | 1 | 2 | 3 | 0 | 4 | 3 | 16 |
| | | 0603 | 0 | 0 | 0 | 0 | 1 | 4 | 7 | 6 | 0 | 1 | 2 | 21 |
| | | 0805 | 0 | 0 | 0 | 1 | 2 | 2 | 6 | 4 | 0 | 9 | 10 | 36 |
| | | | 0 | 1 | 2 | 4 | 2 | 4 | 3 | 6 | 0 | 1 | 5 | 28 |

HIGH RELIABILITY LEADFREE SOLDER ALLOYS FOR HARSH SERVICE CONDITIONS

CROSS REFERENCE TO RELATED APPLICATIONS

The present application claims priority to U.S. Provisional Patent Application No. 62/810,619, filed Feb. 26, 2019, entitled "High Reliability Leadfree Solder Alloys for Harsh Service Conditions," the disclosure thereof incorporated by reference herein in its entirety.

DESCRIPTION OF RELATED ART

The disclosed technology relates generally to solder alloys, and more particularly some embodiments relate to leadfree solder alloys.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 1 depicts the underside of the LED.

FIG. 2 depicts the upper surface of the MCPCB.

FIG. 3 depicts the completed LED module.

FIG. 10 shows the chemical compositions and melting behaviors of various disclosed solder alloys and comparative novel solder alloys FIGS. 11 through 13 each show cross-sectional views of two samples of alloys 25 and 6 during thermal cycling testing from −40° C. to +150° C.

FIG. 14 shows the statistical data of failed chip resistors after 3000 cycles of thermal cycling (−40° C. to +150° C.).

FIG. 15 shows the statistical data of failed chip resistors after 6000 cycles of thermal cycling (−40° C. to +150° C.).

Figure 1:
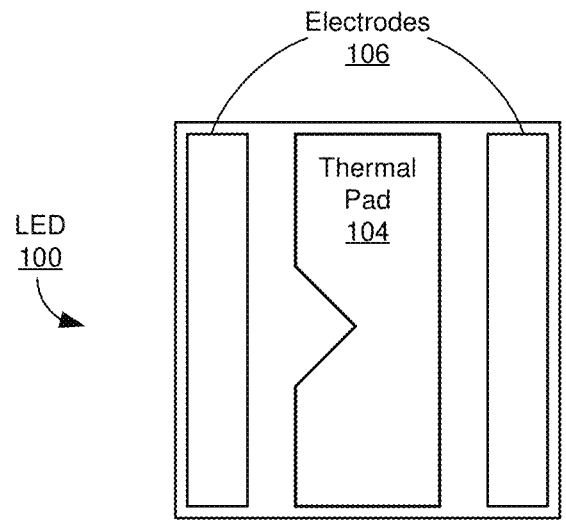
FIGS. 1-3 depict the assembly of an LED module comprising an LED electrically coupled to a Metal Core Printed Circuit Board (MCPCB) by solder according to embodiments of the disclosed technology.

The figures are not exhaustive and do not limit the present disclosure to the precise form disclosed.

DETAILED DESCRIPTION

Embodiments disclosed herein deliver innovative Sn—Ag—Cu—Sb based lead free solder alloys for electronics applications under harsh service environments. The solder alloys can be used in applications such as, for example, printed circuit board (PCB) level assembly for component solder interconnection, high brightness light-emitting diode (LED) chip bonding onto Cu, Al or other substrates and metal core PCBs, and semiconductor die-attachment for power modules. Additives selected from 1.0-3.5 wt % Bi and/or 0.1-1.0 wt % In may be included in the solder alloys. Furthermore, the solder alloys may contain 0.05 to 0.35 wt % Ni.

Lead free solder alloys have been widely adopted by the electronics industry since July 2006 when the Restrictions on Hazardous Substances (RoHS) regulations were implemented in European Union. In the past decade, lead free SnAgCu ("SAC") solder alloys such as Sn3.0Ag0.5Cu (SAC305) and Sn3.8Ag0.7Cu (SAC387) have been widely used in portable, computing and mobile electronics, which serves the operation temperature range of 125° C. and below. Emerging automotive electronics demand service temperatures around 150° C. for the devices used under-the-hood, although the 125° C. and below requirement will likely be maintained for devices in the passenger compartment. Beyond the maximum service temperature, automotive electronics are also required to function in a wide temperature range from a minimum of −40° C. to +150° C. or even wider.

For such harsh electronics environments, the traditional binary or ternary lead-free Sn-rich solder alloys are not reliable enough to survive. Relative to the melting temperature of most Sn-rich solders, the homologous temperature at 150° C. equals to 0.876 for SnAgCu-3Bi, 0.863 for SnAgCu, 0.856 for Sn-3.5Ag and 0.846 for Sn-0.7Cu, indicating that the atomic diffusion will severely facilitate microstructural evolution and accelerate joint degradation. The higher the operating temperature, the quicker the microstructural coarsening and the joint degradation will take place. The disclosed high-reliability solders for higher service temperature applications reflect consideration of metallurgical design to slow down the microstructural evolution of joint solder body and interfacial intermetallic compound (IMC) growth originating from atomic diffusion under thermal migration.

In addition to temperature, automotive electronics need to survive continuous vibration or even mechanical shock during vehicle movement and braking. Ductile joints are desired because of their improved vibration/shock resistance. However, interfacial IMC growth and microstructural coarsening will render the joint more brittle, especially at higher temperatures. Thus, it is desirable not only to design the joint to be ductile, but also to maintain joint ductility during operation under harsh conditions from a metallurgical standpoint.

Beyond the harsh service environment of the automotive electronics, high-temperature and high-reliability Sn-rich solder can be used for high brightness (HB) LED chip component assembly and die attachment in power semiconductor modules if no subsequent board-level reflow is required. For power semiconductor modules, the joule heat generated from the loaded electrical current will increase the joint junction temperature to 150° C. or even higher, depending on the module design. The higher the current density, the higher the junction temperature will be, assuming the heat-dissipation method remains the same. The high electrical current density for HB-LED will heat the junction joint (both anode and cathode joints as well as the thermal pad joint between the two electrodes) up to 150° C. or even higher, similar to power semiconductor modules, depending on the electrical current and cooling pad design. However, the high-power devices, including both HB-LED and power modules, may stress the bonding joint not only with the high junction temperature but also with the high current density. Thus, embodiments of the highly-reliable solder design for power applications may reduce the atomic diffusion under electro-migration, as well as control atomic diffusion under thermal migration.

To address the need for solder materials for both the automotive industry and power semiconductor applications, the disclosed novel metallurgical designs for embodiments of high reliable lead-free solders focus on stabilizing the microstructural evolution and slowing down the interfacial IMC growth under both thermal and current stressing condition.

Embodiments disclosed herein include lead-free solder alloys comprising of: 2.5-4.0 wt % Ag; 0.4-0.8 wt % Cu; 5.0-9.0 wt % Sb; 1.5-3.5 wt % Bi; 0.1-3.0 wt % In; 0.05-0.35 wt % Ni; and a remainder of Sn. These disclosed solder alloys have excellent thermal fatigue resistance under harsh service environments, which require high reliability at operating temperatures of 150° C. or higher. The solders in the claimed range have longer characteristic life times than traditional binary, ternary Sn-rich solders for board-level automotive applications, and for HB-LED chip bonding and die-attachment in power semiconductor module applications. The invented solder alloys are particularly suitable for, but not limited to, producing solder joints, for example in the form of solder preforms, solder balls, solder powder, solder paste (a mixture of solder powder and flux), and the like.

FIG. 10 shows the chemical compositions and melting behaviors of various disclosed solder alloys (Alloy Nos. 1-16) and comparative solder alloys (Alloy Nos. 17-25). The melting behavior of the solder alloys was analyzed using Differential Scanning Calorimetry (DSC) with the same heating and cooling rates of 20° C./min. DSC tests were performed in a TA Q2000 differential scanning calorimeter, scanning from room temperature to 280° C. For each alloy, a sample was first scanned from ambient temperature up to 280° C., followed by cooling down to 25° C., then scanned again up to 280° C. The second heating thermograph was used to represent the melting behavior of alloys. The solidus and liquidus temperatures of solder alloys obtained from the DSC analyses are listed in FIG. 10.

In some embodiments, Sb plays a key role in improving the thermal fatigue resistance of solder joints in harsh thermal cycling or thermal shock conditions. In such embodiments, 5.0 wt % to 9.0 wt % Sb is added in order to maintain the optimized volume fractions of fine SnSb intermetallic compound (IMCs) particles. The fine SnSb IMC particles nucleate and grow (cluster of different atoms in certain stoichiometric ratio) after solder solidification during reflow. These SnSb particles are reversely dissolved back into Sn matrix to form solid solution with increasing temperature, and then precipitate out with the drop of temperature. A sufficient quantity of Sb is important to harden the solder alloy by providing both solid-solution and precipitation strengthening to the alloy. When the amount of Sb is reduced below 3.0 wt %, fine SnSb particles are completely dissolved back into Sn matrix to form a (SnSb) solid solution when serving at 150° C. and above and no SnSb fine particles remain to strengthen the alloy. Strengthening in alloys is associated with interrupting the dislocation movement. Both fine particles embedded in the alloy matrix, and solute atoms in solid solution, act as obstacles to block the dislocation slide along the favorable lattice direction. At high temperature (homologous temperature>0.6), atomic diffusion plays an important role to assist the dislocation movement. For small obstacles like solute atoms, atomic diffusion can easily assist the dislocation to bypass or climb over the obstacles. For large obstacles like precipitates, more atomic diffusion steps are needed to allow the dislocations to bypass or climb over the obstacles. Thus, precipitates are more valuable to maintain high temperature strength through interrupting the dislocation movement. In current invention, 5 wt % and above Sb allows enough precipitates-strengthening even at 150° C. and above. However, if Sb addition exceeds 10 wt %, a coarse and brittle primary $Sn_3Sb_2$ phase is formed in the solder during solidification, making the solder alloy much more brittle. The embrittlement from the $Sn_3Sb_2$ phase is prone to cause the solder joint to fail early in harsh thermal cycling or thermal shock conditions. Therefore, in some embodiments, in order to maintain a balanced strengthening effect, Sb content is more preferably in the range of 5.0-9.0 wt % (optimally 5.0-6.5 wt %).

Ag acts as a major strengthening element in the alloy by forming $Ag_3Sn$ intermetallic particles that act as dispersion strengthening phases. Ag also improves the wettability of solder alloys. Considering the comprehensive performance including melting, wetting, mechanical properties and thermal cycling reliability, Ag content is preferred to be in the range of 2.5-4.5 wt %. When Ag is less than 2.5 wt %, mechanical properties and thermal cycling reliability performance of solder joints may not be sufficient for harsh environment electronics applications because of insufficient $Ag_3Sn$ particles. When Ag is more than 4.5 wt %, the alloy's liquidus temperature is increased significantly, and the formation of $Ag_3Sn$ platelets instead of particles may reduce solder joint ductility. In addition, the cost increase with higher Ag contents is not desirable. Accordingly, in some embodiments, the Ag content is preferably in the range of 3.0-4.0 wt %.

As one of the major constituent elements, Cu improves the mechanical properties of solder by forming $Cu_6Sn_5$ intermetallic particles inside the solder matrix. Enough Cu inside molten solder also greatly reduces Cu leaching from Cu substrate metal or Cu pads. In addition, a higher Cu content in the solder can stabilize the interfacial intermetallic layer by forming the ductile $(Cu,Ni)_6Sn_5$ instead of brittle $Ni_3Sn_4$ on Ni metallization surfaces. A higher Cu content in solder may also prevent dual IMC layer formation on Ni metallization surfaces, namely $(Cu,Ni)_3Sn_4$ formed beneath $(Cu,Ni)_6Sn_5$. Commonly, the dual IMC layers actually weaken the bonding interface. However, when Cu is more than 2.0 wt %, the pasty range becomes too wide, which impacts the soldering wetting, voiding and reliability. Accordingly, in some embodiments, the Cu content is preferably in the range of 0.4-1.0 wt %.

As an additive to the SnAgCuSb alloys, Bi can decrease the solidus and liquidus temperatures of the alloy, which allows the reflow peak temperature to drop accordingly. Bi also reduces the surface tension of molten solders, and thus improves wettability. Bi does not form any IMC precipitates with Ag, Cu, Sb and Sn. Bi strengthens the solder body through Bi particles at low temperature, and hardens the solder body through the formation of solid solution at high temperature. Since Bi is brittle, Bi addition beyond 4 wt % reduces ductility significantly although strength continues to increase. This embrittlement significantly worsens thermal fatigue resistance. Bi continuously decreases the melting temperature with increasing content in the solder and even forms the low melting Bi—Sn phases, which is not desired for high-temperature high-reliability applications. In some embodiments, Bi addition of 1.5-3.5 wt % is preferred for harsh service environment electronics applications.

Similar to Bi, In also reduces the solidus and liquidus temperatures of solder. In is much softer than Bi and Sb, which helps to increase ductility and reduces brittleness introduced by the addition of Bi and Sb. In the disclosed embodiments, with 1.5-3.5 wt % Bi and 5 to 9 wt % Sb addition to improve the wetting and strength of the solder alloy, adopting enough In at the same time minimizes the brittleness introduced by the addition of Bi and Sb. In is prone to get involved into IMC formation similar to Sn, i.e. $Ag_3(SnIn)$, $Cu_6(SnIn)_5$, $Ni_3(SnIn)_4$, and even $(CuNi)_6(SnIn)_5$ etc. The complicated IMC structure slows down IMC coarsening and thickening (needing more atoms to diffuse towards the IMCs to support the growth) under elevated temperatures. This stabilizes the IMCs and thereafter benefits precipitate strengthening and alleviates IMC growth and the associated joint embrittlement. However, In is more prone to oxidize than Bi, which significantly reduces wetting and increases voiding during reflow if adding more than 4.5 wt % In into the solder. Thus, In addition of 4.5 wt % or below is preferred in some embodiments. A preferred In content in the alloy also depends on the Sb content. In addition decreases melting temperature dramatically. To maintain high temperature performance of the joint, In addition is preferred to be less than 3.0 wt % to avoid the formation of these low incipient melting phases in the alloy.

In some embodiments, 0.05-0.35 wt % of Ni is added to further improve the alloy's mechanical properties and solder joint reliability performance. During soldering, enough Ni is involved into the interfacial IMC formation especially on Cu metallization to form $(CuNi)_6Sn_5$ instead of $Cu_6Sn_5$. The existence of Ni inside the $(CuNi)_6Sn_5$ layer slows the IMC growth during reflow and post-reflow service, which is important to maintain interface stability and joint ductility. Ni has very limited solubility in Sn. When Ni is more than 0.4 wt %, the solder's liquidus temperature is dramatically increased. Together with the reactivity of Ni to oxidation, negative impacts on wetting and soldering with more than 0.4 wt % Ni are seen, especially for fine powder solder paste. Thus, the upper limit for Ni additions is preferably 0.35 wt % in various embodiments. Meanwhile, the interface IMC stabilization is marginal for less than 0.05 wt % Ni content due to insufficient Ni involvement into the interfacial reaction. Therefore, in some embodiments, 0.05-0.35 wt % of Ni is preferred.

Alloys designed within the disclosed technology have been tested for board-level assembly, HB-LED applications, and power semiconductor module applications. Significant improvements have been achieved, compared with conventional Sn—Ag, Sn—Cu and Sn—Ag—Cu alloys. For example, HB-LED power cycling tests have shown that the characteristic time comparing to traditional SAC305 (Alloy 25) have been increased up to three times from 3893 to 11960 cycles (Alloy 13).

Figure 2:
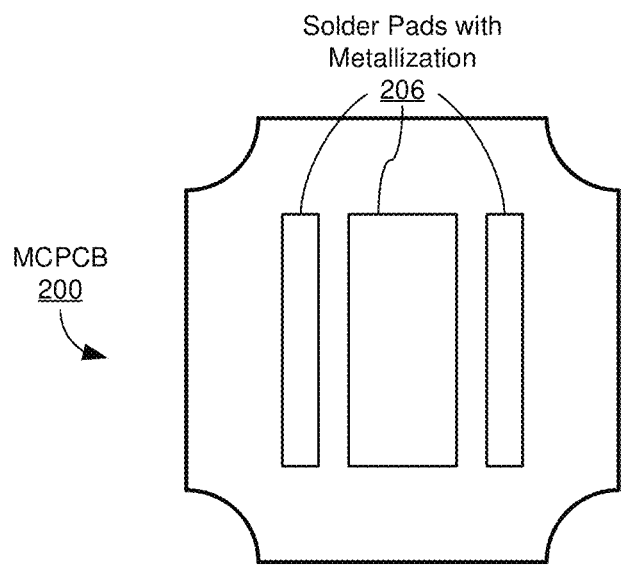
Figure 3:
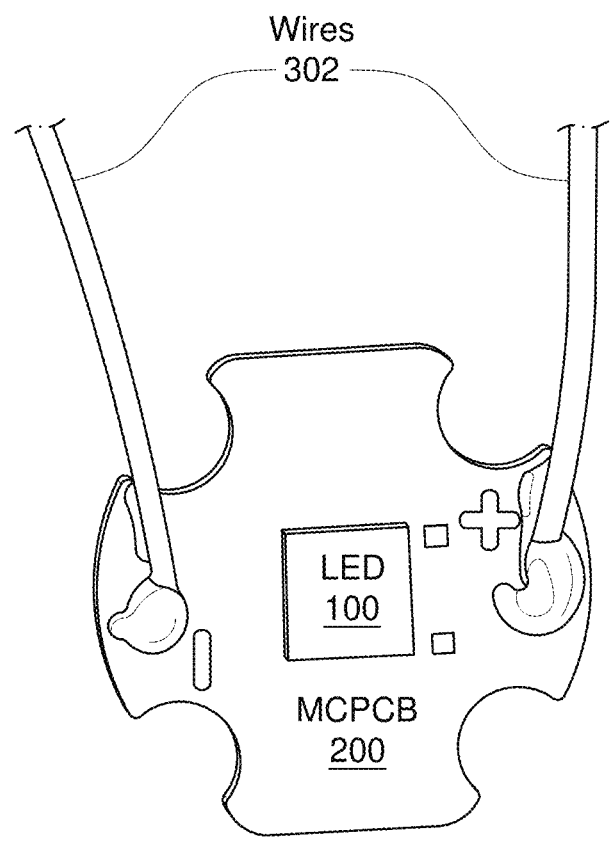

FIGS. 1-3 depict the assembly of an LED module comprising an LED electrically coupled to a Metal Core Printed Circuit Board (MCPCB) by solder according to embodiments of the disclosed technology. FIG. 1 depicts the underside of the LED 100. The underside includes three solder pads. One of the solder pads is a thermal pad 104, while the other two solder pads 106 are for the electrodes of the LED 100. FIG. 2 depicts the upper surface of the MCPCB 200. Three solder pads with metallization 206 are disposed upon the upper surface of the MCPCB 200. These solder pads 206 correspond to the solder pads 104 of the LED 100. FIG. 3 depicts the completed LED module 300, with the LED 100 joined to the MCPCB 200, and with wires 302 joined to the MCPCB 200.

Figure 4:
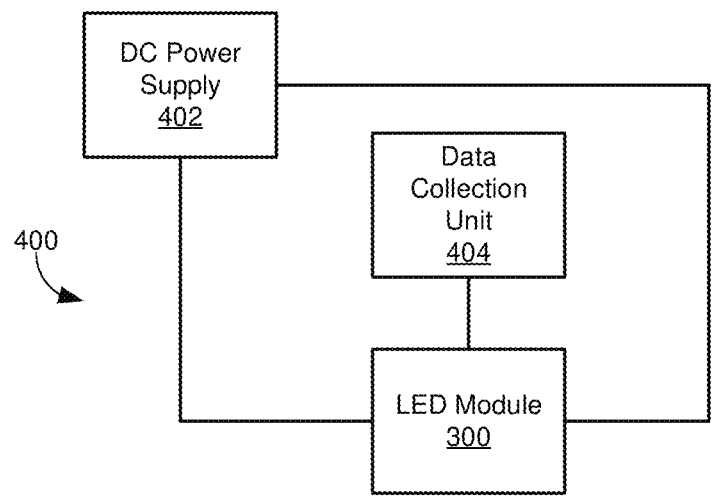
FIG. 4 illustrates a system for testing LED modules when assembled using different solder alloys according to a power cycling reliability test.
Figure 5:
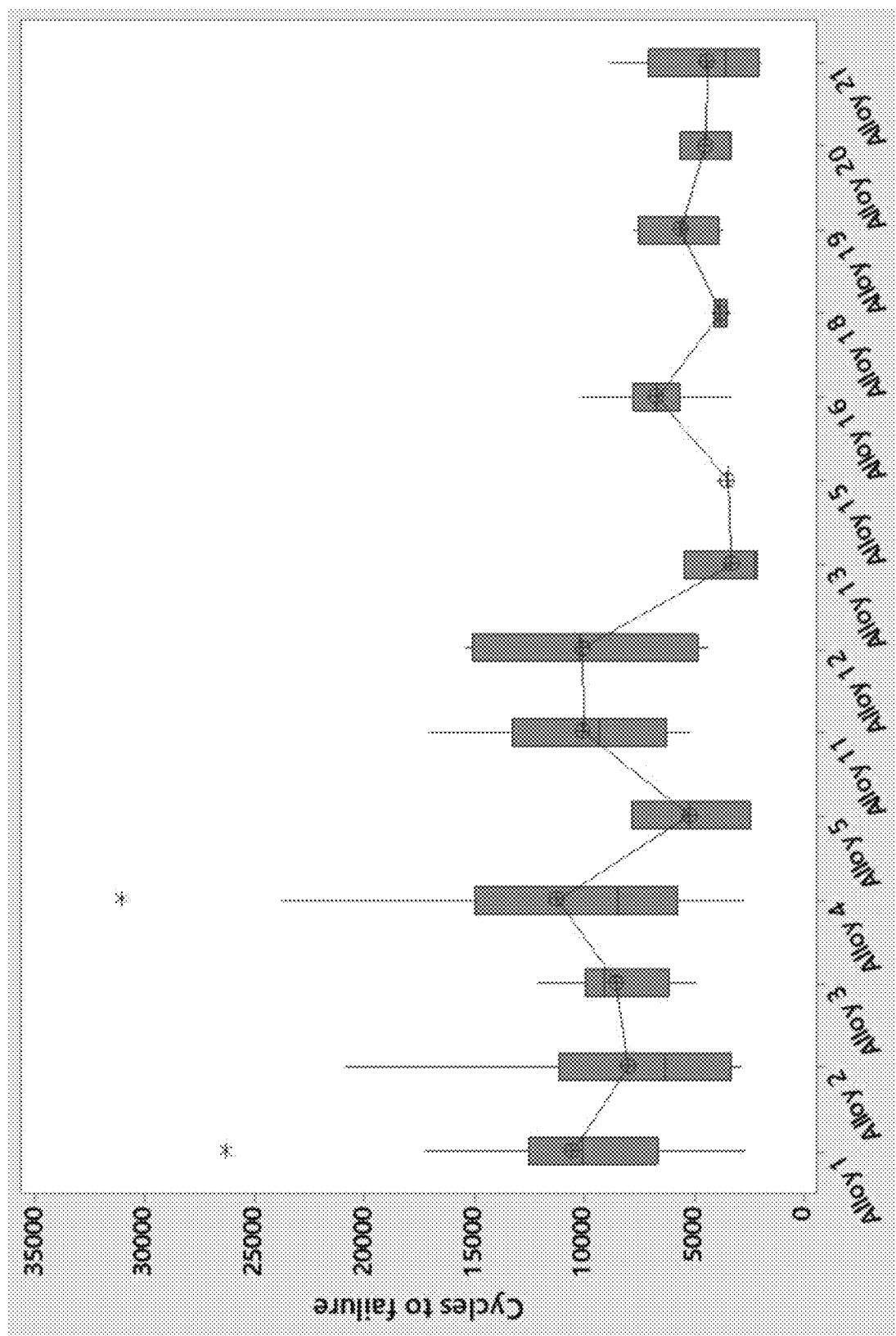
FIG. 5 depicts a boxplot of the data collected during the test for several solder alloys.
Figure 6:
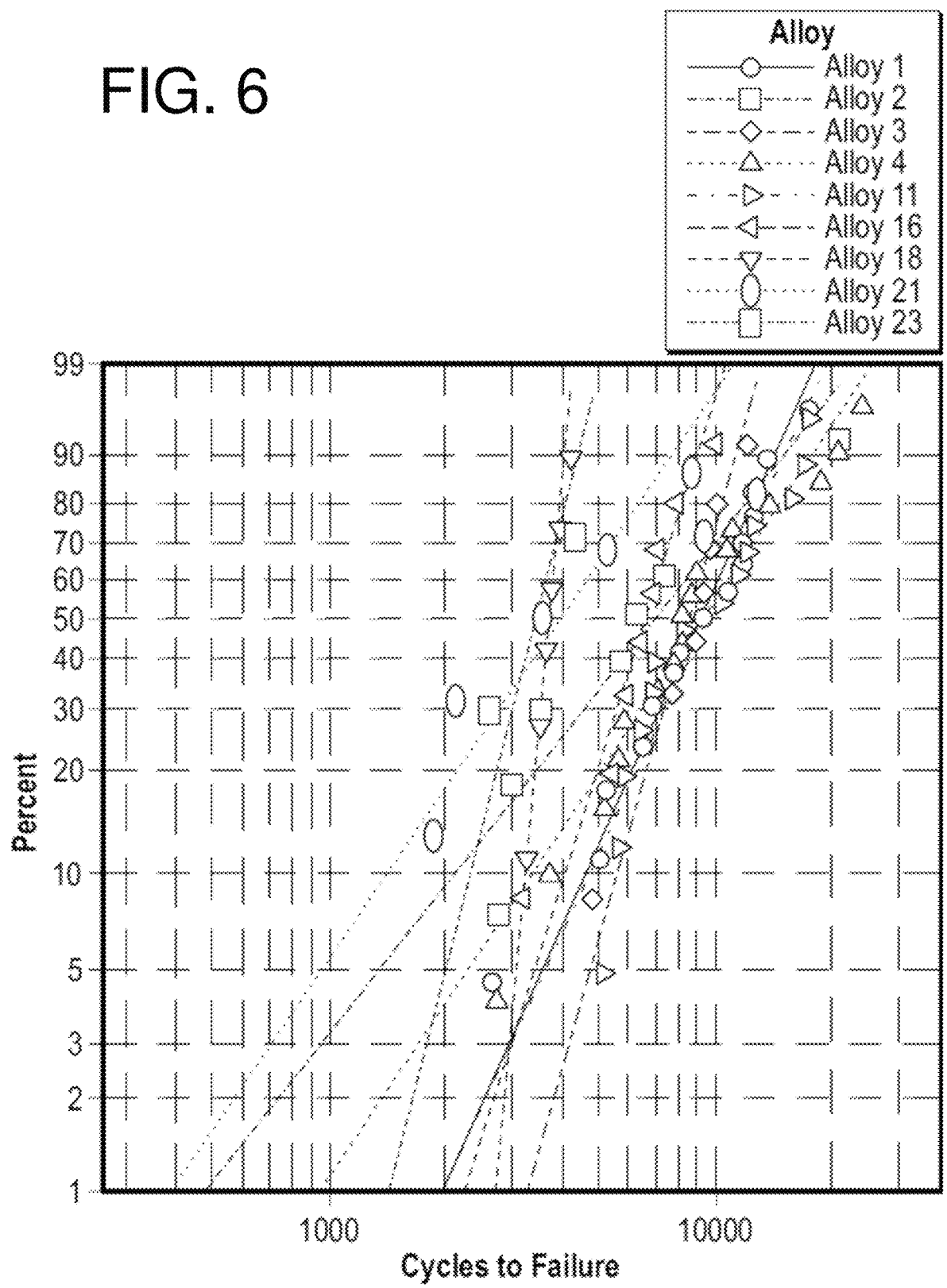
FIG. 6 depicts a plot showing the percentage of LED modules that failed vs. the number of cycles to failure.

FIG. 4 illustrates a system 400 for testing LED modules 300 when assembled using different solder alloys according to a power cycling reliability test. The system 400 includes a direct current (DC) power supply 402 connected to the wires 302 of the LED module 300, and a data collection unit 404 to collect data for the test. During the test, each LED module was power-cycled until failure. Each cycle included applying power for 8 seconds, followed by no power for 20 seconds. FIG. 5 depicts a boxplot 500 of the data collected during the test for several solder alloys. FIG. 6 depicts a plot showing the percentage of LED modules that failed vs. the number of cycles to failure. From FIGS. 5 and 6 it can be seen that alloys 4, 11, and 12 have longer characteristic lifetimes than other alloys, especially alloys 18-21 which do not have Ni addition. The results indicate that Ni addition to the solder alloys is beneficial to improve the lifetimes of LED devices.

Figure 7:
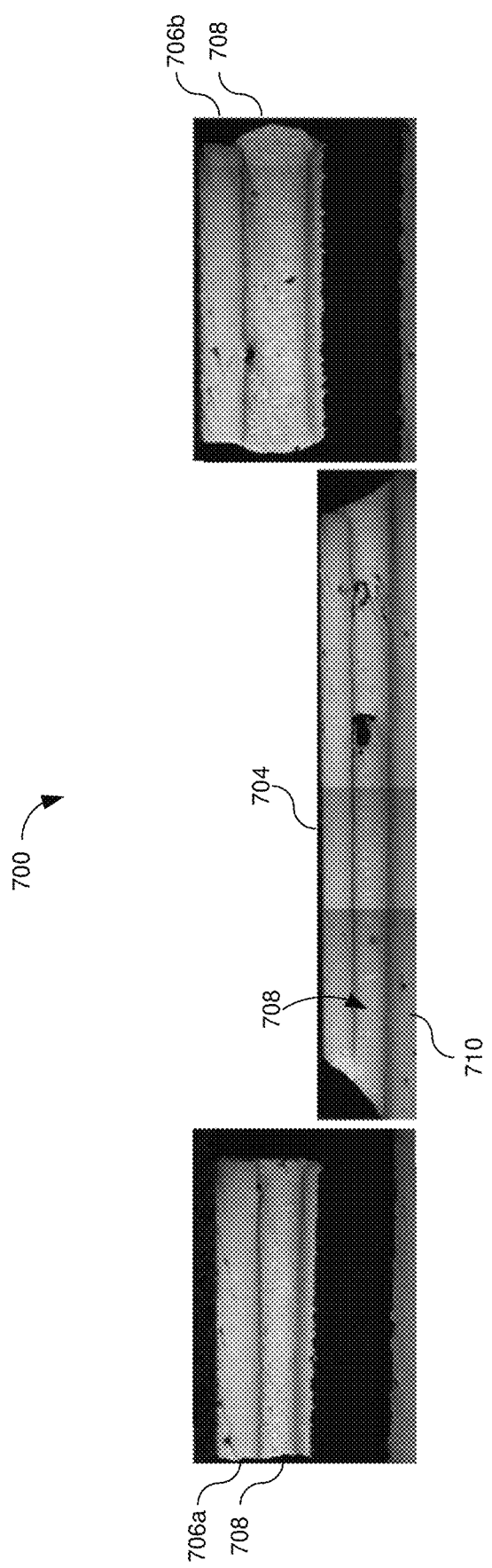
FIG. 7 depicts a cross-section of an LED module before the power cycling reliability test.

FIG. 7 depicts a cross-section of an LED module 700 before the power cycling reliability test. The electrodes of the LED module 700 are shown at 706a,b. The thermal pad is shown at 704. The MCPCB is shown at 710. Solder paste is shown at 708.

Figure 8:
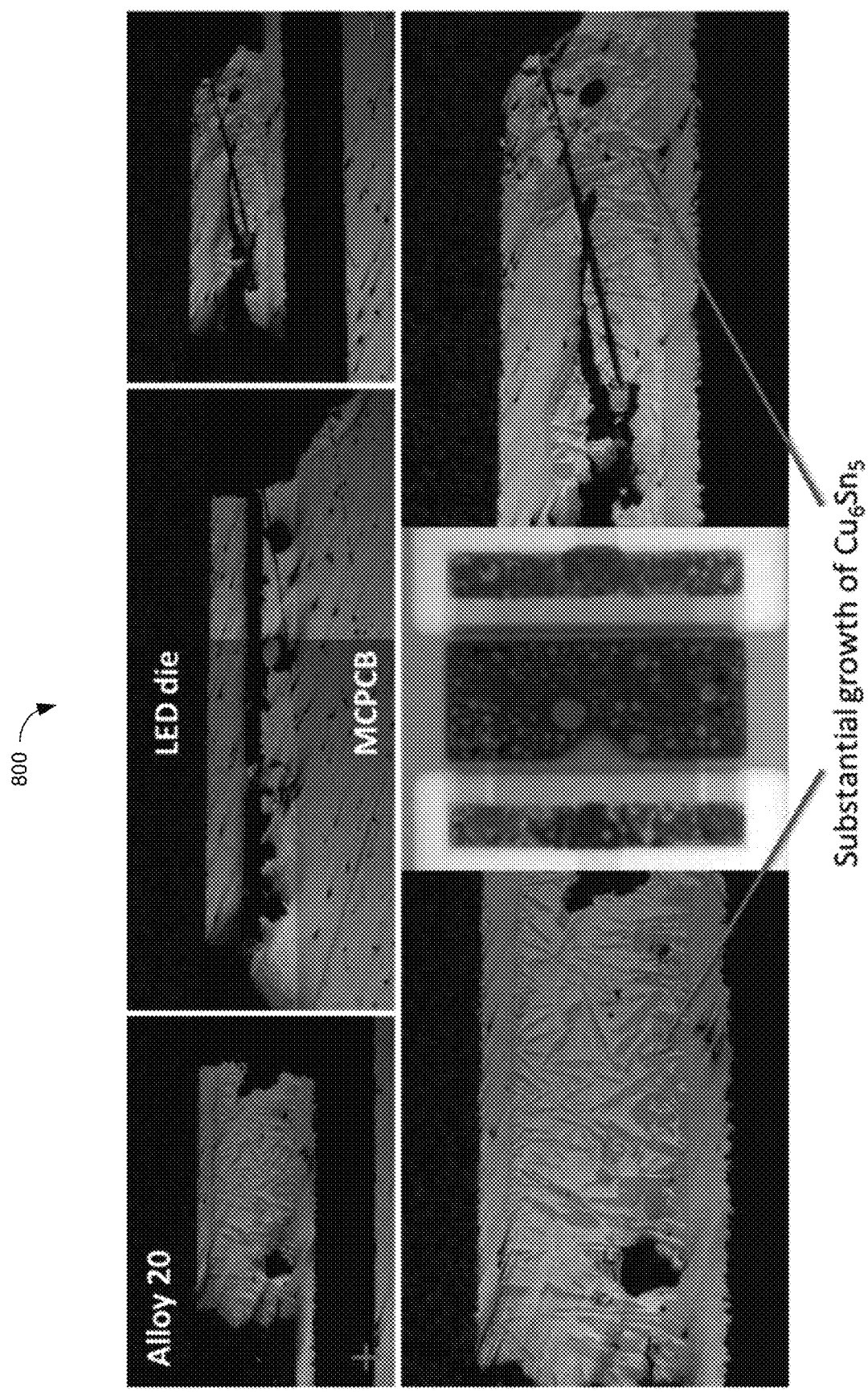
FIG. 8 depicts a cross-section of an LED module using alloy 20 solder paste after failing during the power cycling reliability test.
Figure 9:
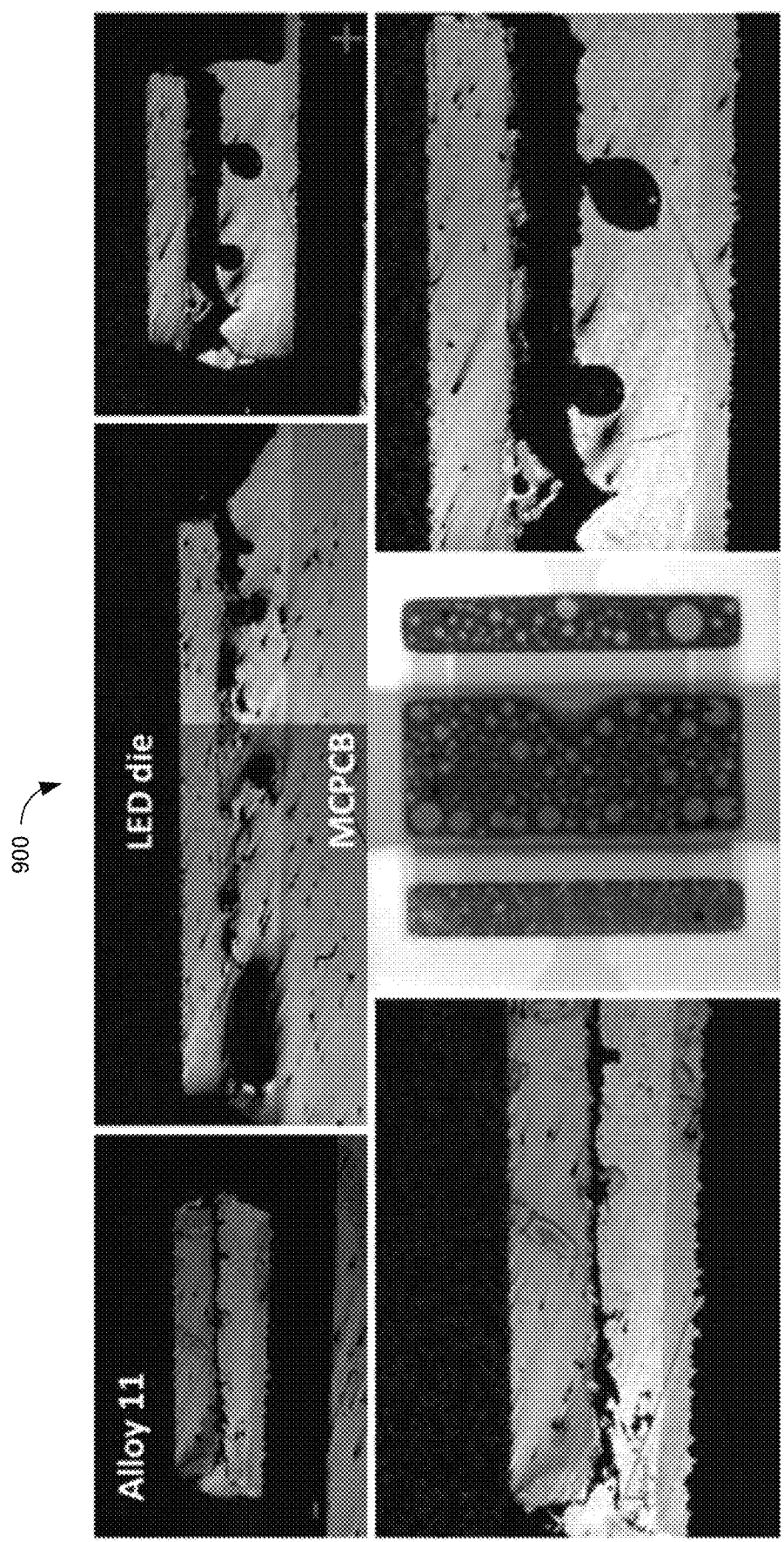
FIG. 9 shows similar images for alloy 11.

FIG. 8 depicts a cross-section of an LED module 800 using alloy 20 solder paste after failing during the power cycling reliability test. Referring to FIG. 8, significant cracks are seen, as well as substantial growth of $Cu_6Sn_5$. A top-view radiographic image is shown at the lower center of FIG. 8. FIG. 9 shows similar images for alloy 11. These radiographic images show the circular voids (white in color) in the LED device.

The board-level reliability under harsh service environment was also evaluated for these alloys. The solder pastes were mixed using the solder alloy powders shown in FIG. 10 with a flux. Afterwards, the solder pastes were tested for both chip resistor and ball grid array (BGA) assemblies under harsh thermal cycling conditions from −40° C. to +150° C.

Figure 11:
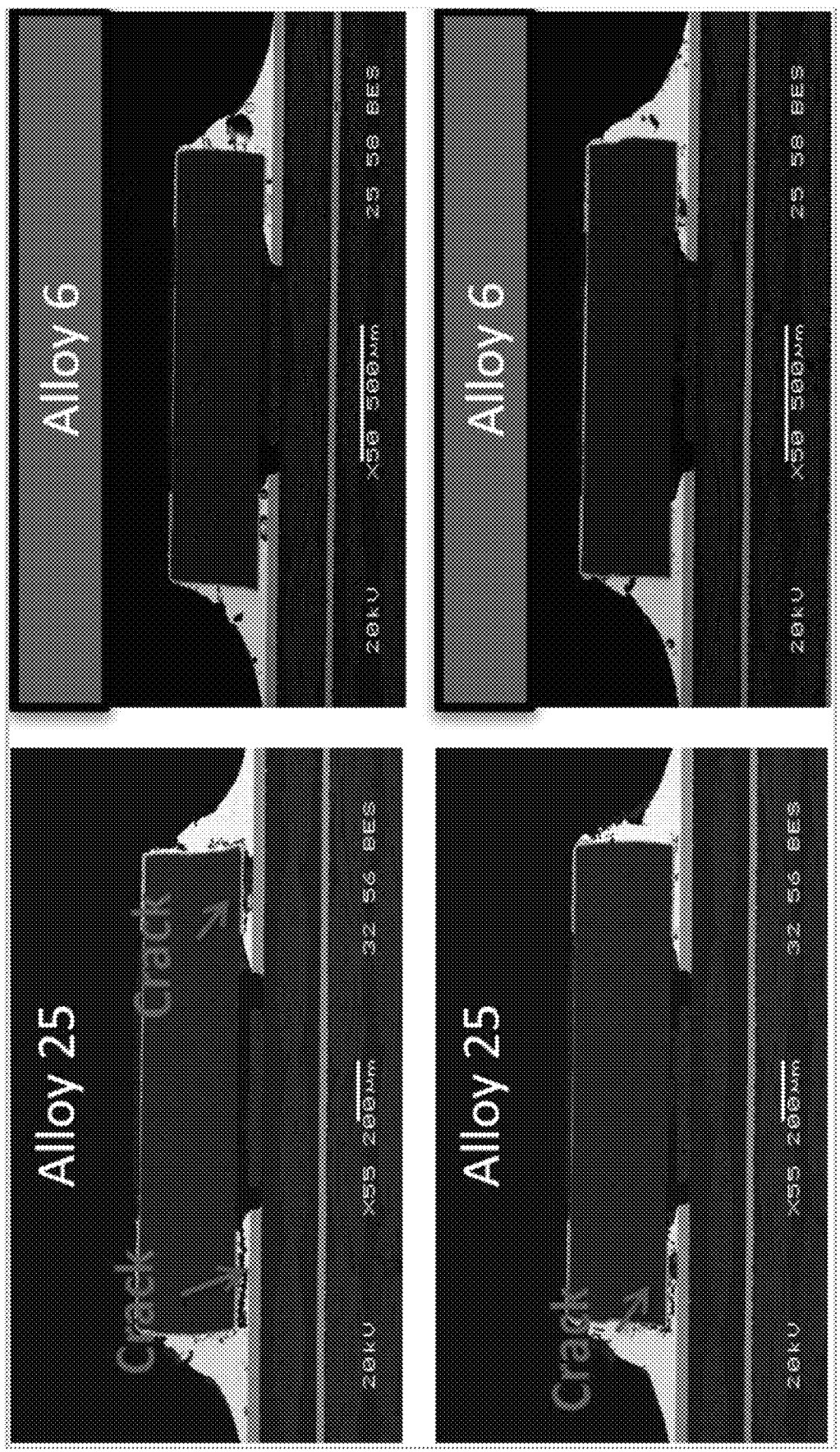
FIG. 11 shows the alloys at 1839 cycles.
Figure 12:
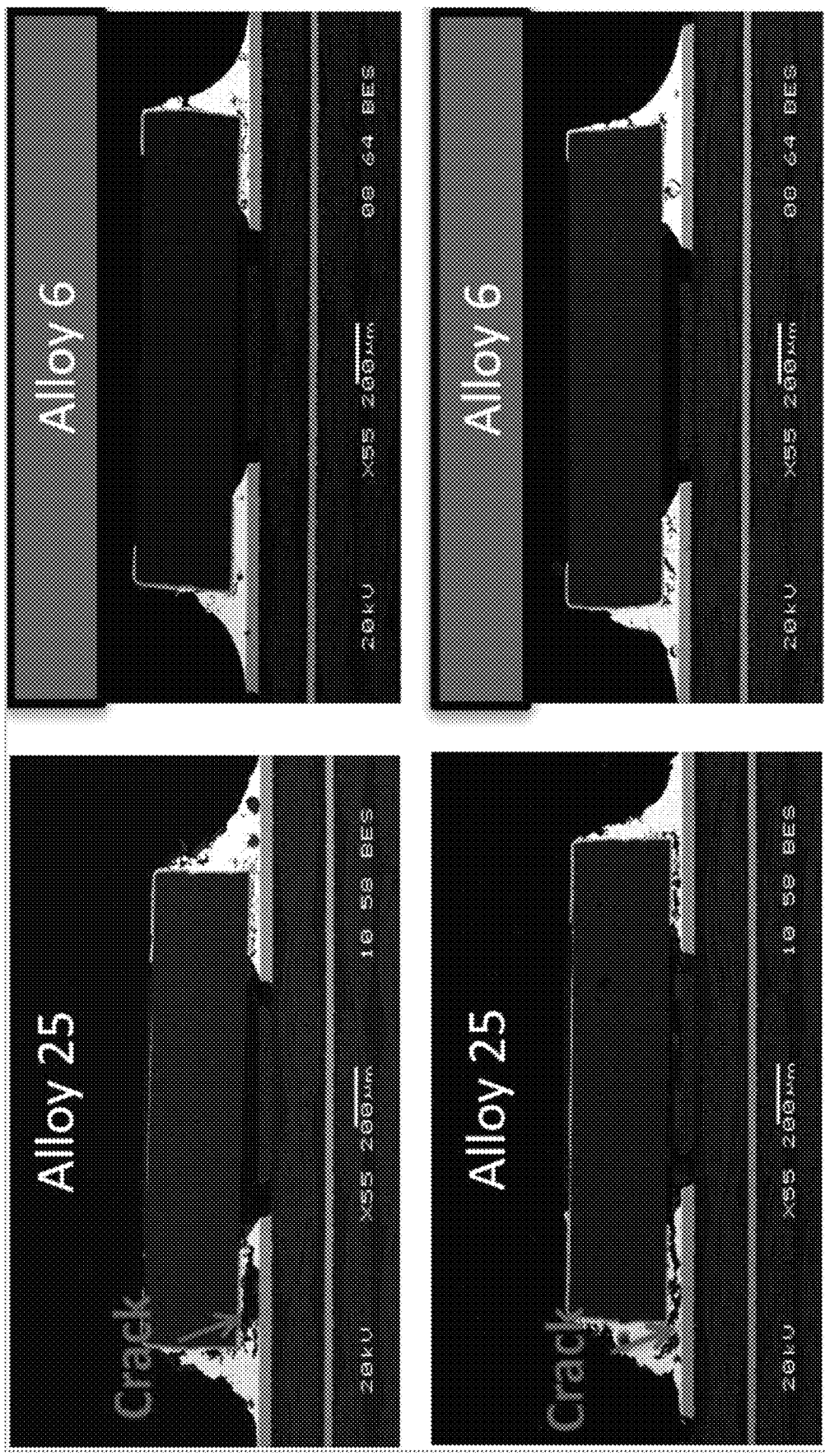
FIG. 12 shows the alloys at 2565 cycles.
Figure 13:
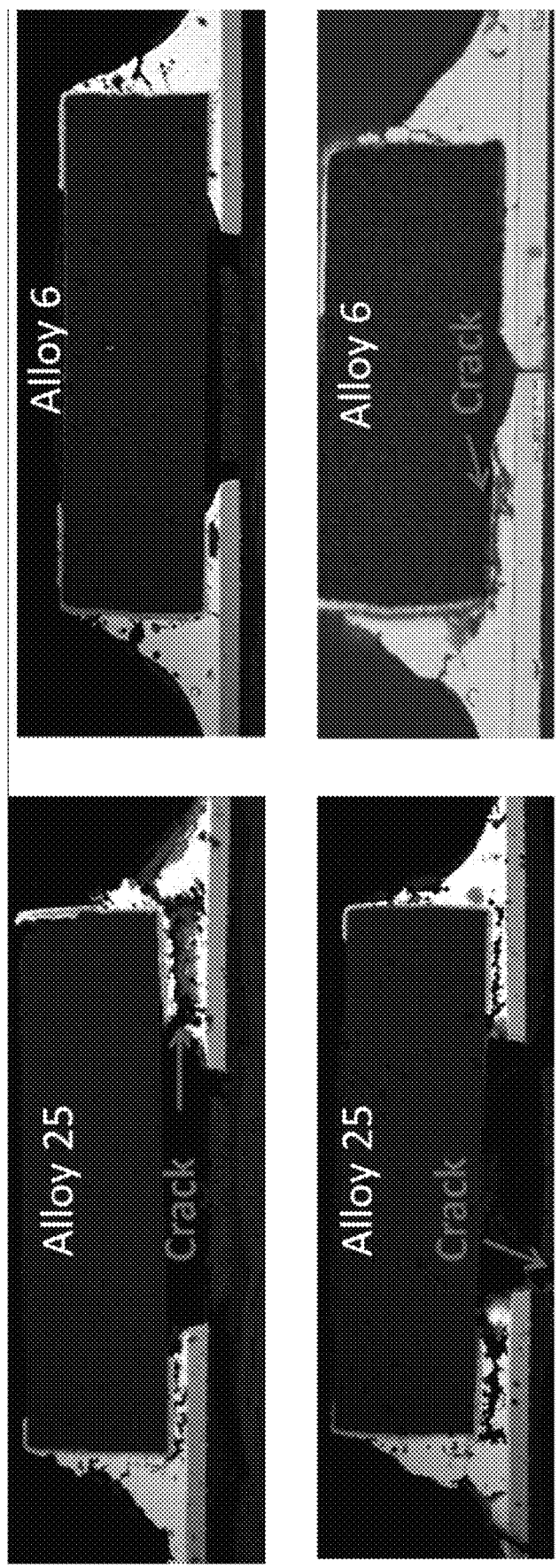
FIG. 13 shows the alloys at 3012 cycles.

FIGS. 11 through 13 each show cross-sectional views of two samples of alloys 25 and 6 during thermal cycling testing from −40° C. to +150° C. FIG. 11 shows the alloys at 1839 cycles. FIG. 12 shows the alloys at 2565 cycles. FIG. 13 shows the alloys at 3012 cycles. From these images it can be seen that the disclosed alloy 6 exhibits massively improved crack resistance over conventional alloy 25 (SAC305).

FIG. 14 shows the statistical data of failed chip resistors after 3000 cycles of thermal cycling (−40° C. to +150° C.). FIG. 15 shows the statistical data of failed chip resistors after 6000 cycles of thermal cycling (−40° C. to +150° C.). Each row in these tables represents the testing of 60 resistors. The fluxes in the "Flux" column are denoted A for Indium8.9HF, B for Indium10.1HF, and C for Indium3.2HF, all of which are commercially available. The resistors in the "Chip Resistor Type" column are denoted by package type number.

It is evident that the disclosed alloys 6 and 11 performed better than comparative alloys (for example, alloys 21, 24 and 25). The data also indicates the choice of flux has an effect on the reliability of the solder joint.

Embodiments have also been tested for power module packages, in which a Si die is bonded onto a ceramic substrate. The characteristic life of the packages under −40° C. to 175° C. thermal cycling show much slower degradation of the bond joint strength compared with traditional SAC305 alloys.

While various embodiments of the disclosed technology have been described above, it should be understood that they have been presented by way of example only, and not of limitation. Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

It should be noted that the terms "optimize," "optimal" and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A solder alloy, consisting of:
   2.5-4.0 wt % Ag;
   0.4-0.8 wt % Cu;
   5.0-9.0 wt % Sb;
   2.8-3.5 wt % Bi;
   0.05-0.35 wt % Ni;
   0.1-3.0 wt % In; and
   a remainder of Sn.

2. The solder alloy of claim 1, wherein the solder alloy consists of 3.0-4.0 wt % Ag, 0.5-0.7 wt % of Cu, 5.0-6.0 wt % Sb, 2.8-3.5 wt % Bi, 0.3-0.6 wt % In, 0.1-0.2 wt % Ni, and the remainder of Sn.

3. The solder alloy of claim 1, wherein the solder alloy consists of 3.0-4.0 wt % Ag, 0.5-0.7 wt % Cu, 5.5 wt % Sb, 2.8-3.5 wt % Bi, 0.05-0.35 wt % Ni, 0.3-0.6 wt % In, and the remainder of Sn.

4. The solder alloy of claim 3, wherein the solder alloy consists of 3.0-4.0 wt % Ag, 0.5-0.7 wt % Cu, 5.5 wt % Sb, 3.2 wt % Bi, 0.05-0.35 wt % Ni, 0.3-0.6 wt % In, and the remainder of Sn.

5. The solder alloy of claim 4, wherein the solder alloy consists of 3.2 wt % Ag, 0.7 wt % Cu, 5.5 wt % Sb, 3.2 wt % Bi, 0.5 wt % In, 0.2 wt % Ni, and the remainder of Sn.

6. The solder alloy of claim 4, wherein the solder alloy consists of 3.2 wt % Ag, 0.7 wt % Cu, 5.5 wt % Sb, 3.2 wt % Bi, 0.5 wt % In, 0.3 wt % Ni, and the remainder of Sn.

7. The solder alloy of claim 1, wherein the solder alloy consists of 3.2 wt % Ag, 0.7 wt % Cu, 5.5 wt % Sb, 3.2 wt % Bi, 0.1 wt % In, 0.1 wt % Ni, and the remainder of Sn.

8. The solder alloy of claim 1, wherein the solder alloy consists of 3.0-4.0 wt % Ag, 0.5-0.7 wt % Cu, 5.0-6.0 wt % Sb, 3.2 wt % Bi, 0.05-0.35 wt % Ni, 0.3-0.6 wt % In, and the remainder of Sn.

9. The solder alloy of claim 8, wherein the solder alloy consists of 3.0-4.0 wt % Ag, 0.5-0.7 wt % Cu, 5.0-6.0 wt % Sb, 3.2 wt % Bi, 0.05-0.35 wt % Ni, 0.5 wt % In, and the remainder of Sn.

10. A solder paste, comprising:
    flux; and
    a solder alloy powder consisting of:
       2.5-4.0 wt % Ag;
       0.4-0.8 wt % Cu;
       5.0-9.0 wt % Sb;
       2.8-3.5 wt % Bi;
       0.05-0.35 wt % Ni;
       0.1-3.0 wt % In; and
       a remainder of Sn.

11. The solder paste of claim 10, wherein the solder alloy powder consists of 3.0-4.0 wt % Ag, 0.5-0.7 wt % of Cu, 5.0-6.0 wt % Sb, 2.8-3.5 wt % Bi, 0.3-0.6 wt % In, 0.1-0.2 wt % Ni, and the remainder of Sn.

12. The solder paste of claim 10, wherein the solder alloy powder consists of 3.0-4.0 wt % Ag, 0.5-0.7 wt % Cu, 5.5 wt % Sb, 3.2 wt % Bi, 0.05-0.35 wt % Ni, 0.3-0.6 wt % In, and the remainder of Sn.

13. An apparatus comprising:
a component comprising:
a main ceramic body, and
a side surface having disposed thereon an electrode and a thermal pad;
a copper substrate; and
a solder alloy electrically coupling the component and the copper substrate, wherein the solder alloy consists of:
2.5-4.0 wt % Ag;
0.4-0.8 wt % Cu;
5.0-9.0 wt % Sb;
2.8-3.5 wt % Bi;
0.05-0.35 wt % Ni;
0.1-3.0 wt % In; and
a remainder of Sn.

14. The apparatus of claim 13, wherein the solder alloy consists of 3.0-4.0 wt % Ag, 0.5-0.7 wt % of Cu, 5.0-6.0 wt % Sb, 2.8-3.5 wt % Bi, 0.3-0.6 wt % In, 0.1-0.2 wt % Ni, and the remainder of Sn.

15. The apparatus of claim 13, wherein the solder alloy consists of 3.0-4.0 wt % Ag, 0.5-0.7 wt % Cu, 5.5 wt % Sb, 2.8-3.5 wt % Bi, 0.05-0.35 wt % Ni, 0.3-0.6 wt % In, and the remainder of Sn.

16. The apparatus of claim 13, wherein the solder alloy consists of 3.0-4.0 wt % Ag, 0.5-0.7 wt % Cu, 5.0-6.0 wt % Sb, 3.2 wt % Bi, 0.05-0.35 wt % Ni, 0.3-0.6 wt % In, and the remainder of Sn.

17. An apparatus comprising:
a light-emitting diode (LED) component;
a Metal Core Printed Circuit Board (MCPCB); and
a solder alloy electrically coupling the LED component and the MCPCB, wherein the solder alloy consists of:
2.5-4.0 wt % Ag;
0.4-0.8 wt % Cu;
5.0-9.0 wt % Sb;
2.8-3.5 wt % Bi;
0.05-0.35 wt % Ni;
0.1-3.0 wt % In; and
a remainder of Sn.

18. The apparatus of claim 17, wherein the solder alloy consists essentially of 3.0-4.0 wt % Ag, 0.5-0.7 wt % of Cu, 5.0-6.0 wt % Sb, 2.8-3.5 wt % Bi, 0.3-0.6 wt % In, 0.1-0.2 wt % Ni, and the remainder of Sn.

19. The apparatus of claim 17, wherein the solder alloy consists of 3.0-4.0 wt % Ag, 0.5-0.7 wt % Cu, 5.5 wt % Sb, 2.8-3.5 wt % Bi, 0.05-0.35 wt % Ni, 0.3-0.6 wt % In, and the remainder of Sn.

20. The apparatus of claim 17, wherein the solder alloy consists of 3.0-4.0 wt % Ag, 0.5-0.7 wt % Cu, 5.0-6.0 wt % Sb, 3.2 wt % Bi, 0.05-0.35 wt % Ni, 0.3-0.6 wt % In, and the remainder of Sn.

* * * * *